United States Patent [19]
Halsey et al.

[11] Patent Number: 5,017,793
[45] Date of Patent: May 21, 1991

[54] OPTICALLY DRIVEN RF GENERATOR

[75] Inventors: James D. Halsey, Falls Church; Robert F. Riggs, Charlottesville; Lawrence H. Gilligan, Charlottesville; David W. Gerdt, Charlottesville, all of Va.

[73] Assignee: Sperry Marine Inc., Charlottesville, Va.

[21] Appl. No.: 412,723

[22] Filed: Sep. 26, 1989

[51] Int. Cl.$^5$ ............................................. G02B 27/00
[52] U.S. Cl. ..................................... 250/551; 307/311
[58] Field of Search .......................... 250/213 A, 551; 307/311; 455/617, 618, 619

[56] References Cited

U.S. PATENT DOCUMENTS 3,171,964  3/1965  Terlet .............................. 250/213 A
3,353,116  11/1967 Trimble ........................... 250/213 A Primary Examiner—David C. Nelms
Attorney, Agent, or Firm—Seymour Levine

[57] ABSTRACT

An optically driven signal generator utilizes optical switches having a common output port and input ports alternately coupled to first and second potentials of opposite polarities. Optical pulses, with interpulse periods commensurate with a desired output frequency, sequentially operate the switches so that electrical signals of opposite polarities are alternately coupled to a common output port in a manner to establish a continuous electrical signal at a frequency that is commensurate with the interpulse periods.

10 Claims, 4 Drawing Sheets

1

OPTICALLY DRIVEN RF GENERATOR

BACKGROUND OF THE INVENTION

1. Field of the Invention

The invention pertains to the generation of RF signals and more particularly to the generation of high power signals at frequencies in the microwave range.

2. Description of the prior art

High power oscillators of the prior art include the well known magnetron, klystron, and traveling wave tube (TWT). Though these devices reliably deliver high power at microwave frequencies the size and weight concomitant with this power for many applications is excessive. Power at microwave frequencies, however, may be provided with the relatively recent development of solid state devices capable of operating at microwave frequencies. These solid state devices include the IMPATT, TRAPATT, and Gunn diodes as well as silicon bipolar and gallium arsenide field effect transistors. These devices are small and may be positioned for tuning in small resonant cavities characteristic of microwave frequencies. Such circuits, though small, do not provide sufficient power for many applications. To produce the required power for these applications it is necessary to use a multiplicity of these low power oscillators. This requires additional circuitry for coherently combining the generated signals, resulting in additional size and complexity.

This invention provides a small, relatively simple, high power microwave oscillator.

SUMMARY OF THE INVENTION

A microwave signal generator in accordance with the principals of the present invention utilizes a multiplicity of electrical potential sources, each respectively coupled to an input line positioned on a photon-excited solid state material that is responsive to optical energy. This material reacts with sufficient rapidity to energy variations of a photon pulse incident thereto, thereby providing a signal at the output terminal of the switch that follows the shape of the photon pulse. In accordance with the invention, the switch input terminals are coupled to voltage sources having equal amplitudes in an alternate polarity sequence and the output terminals of the switches are coupled to a common node whereat a sinusoidal signal is realized.

DESCRIPTION OF THE PREFERRED EMBODIMENTS

Figure 1:
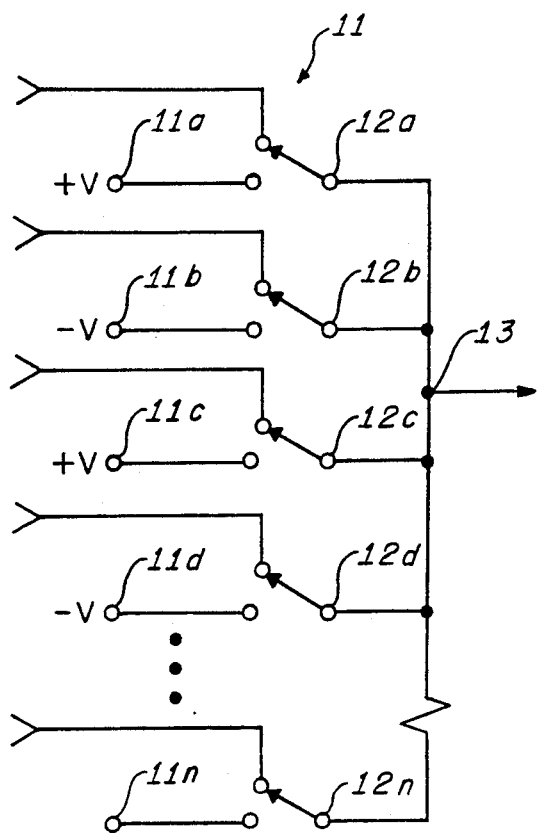
FIG. 1 is a schematic diagram of a series of switches that is useful for explaining the operation of the invention.
Figure 2:
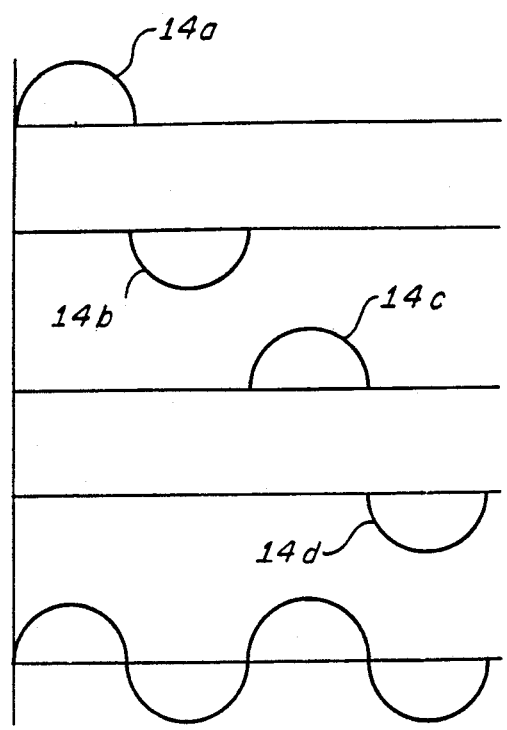
FIG. 2 is a series of wave forms for explaining the generation of the output waveform of FIG. 1.

Refer to FIG. 1 wherein a multiplicity of switches are shown having individual input terminals 11a through 11n and output terminals 12a through 12n all coupled at a node 13 to provide a common output terminal. Coupled to the input terminals are constant voltage sources of equal amplitude in an alternating polarity sequence. If the switches are operated in sequence and provide a half sinusoid impedance variation over the switch operation time the signal at the output of each switch will be half a sinusoid as indicated by the wave forms 14a through 14d in FIG. 2. Activation of the second switch in the sequence at the conclusion of the half sinusoid 14a at output terminal 12a provides the half sinusoid 14b of negative polarity. Continuing this sequence, activation of the third switch at the conclusion of the half sinusoid 14b provides the half sinusoid 14c of positive polarity after which the half sinusoid 14d of negative polarity is provided by the fourth switch. These half sinusoids are coupled to the node 13 in the time sequence shown in FIG. 2 to establish the sinusoidal wave form.

Figure 3:
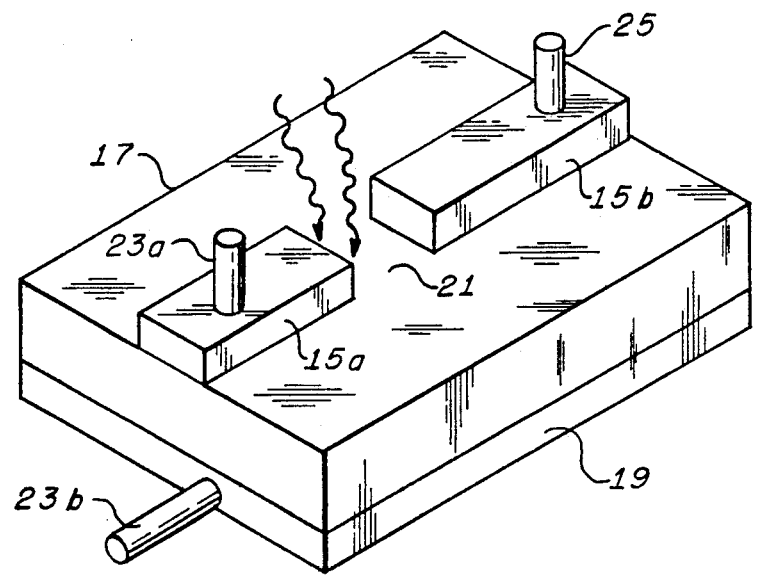
FIG. 3 is a representation of a photoconductive switch utilized in the preferred embodiments of the invention.

Switches that provide an amplitude modulation of a signal coupled to an input port may comprise a photoconductive material such as iron doped indium phosphide and an optical source. This photo sensitive material reacts with sufficient rapidity to follow the intensity variations of incidents light. FIG. 3 is an isometric view of such a switch. A microstrip transmission line formed by metallic strips 15a and 15b are positioned on a substrate 17, which may comprise iron doped indium phosphide substrate 17 which is backed by a conducting ground plane 19. A gap 21 between the metallic strips 15a and 15b is located to receive photons from an optical source, as for example, a laser, not shown. Electrodes 23a and 23b extend from metallic strip 15a and from the ground plane 19, respectively, for coupling to a voltage source not shown. When the gap 21 is illuminated by photons, the potential across the input terminals 23a and 23b is coupled from the metallic strip 15a via the gap 21 to the metallic strip 15b. If the potential across the input terminals 23a and 23b is of constant amplitude the shape and length of the output signal is a function of the waveform of the optical pulse provided by the laser. For example, an optical pulse exhibiting a Gaussian envelope provides a Gaussian signal at the output port formed by the terminal 25 coupled to the metallic strip 15b at a terminal coupled to the metallic ground plane 19 that is not shown in the figure.

Figure 4A:
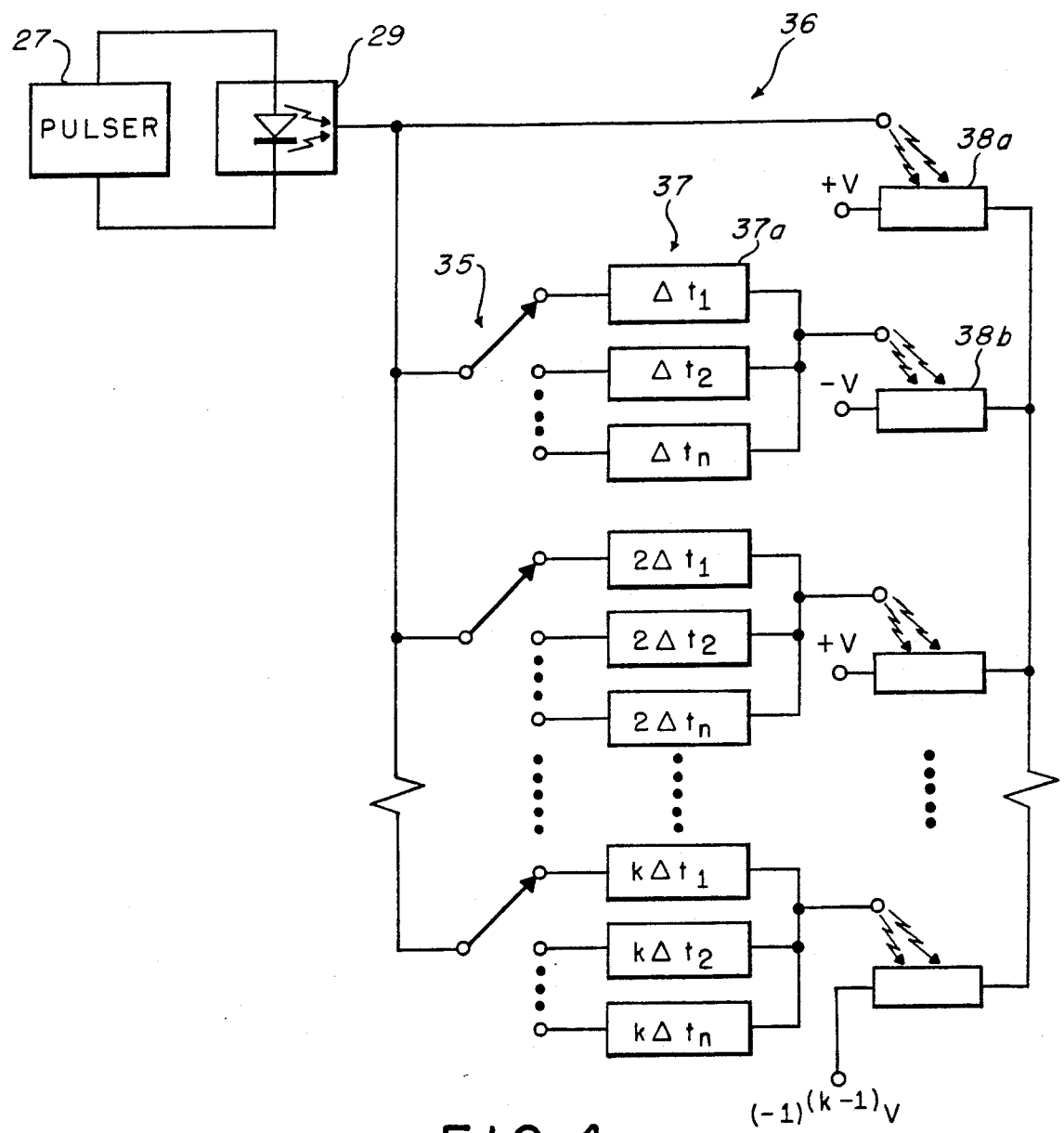
FIG. 4a is a schematic diagram of a preferred embodiment of the invention.
Figure 5:
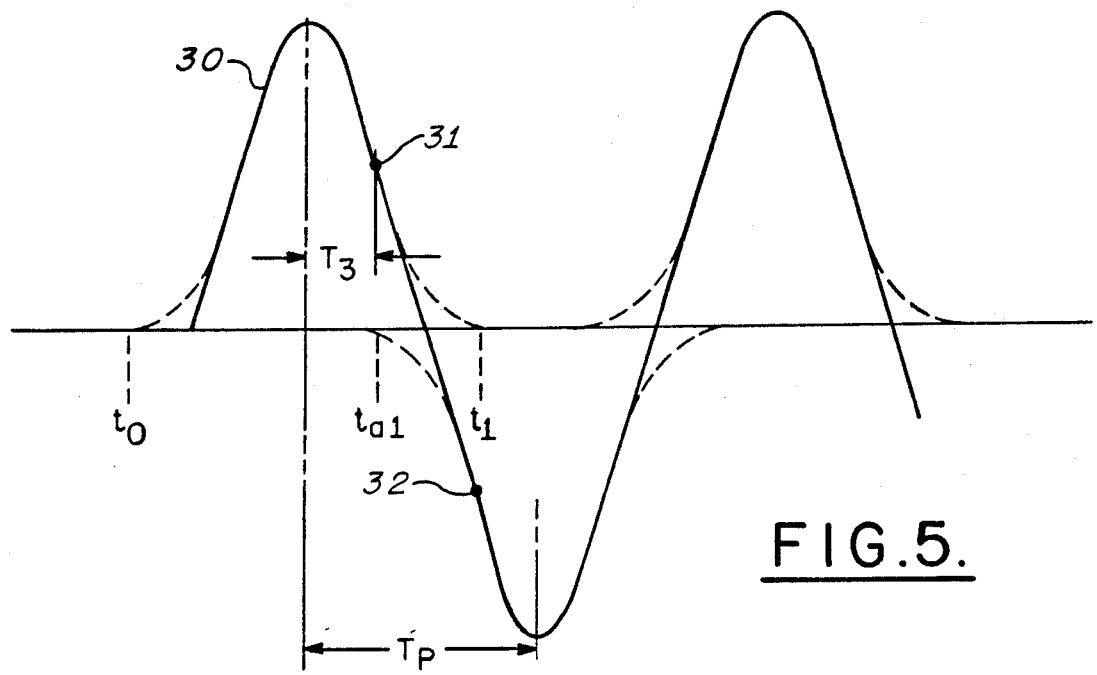
FIG. 5 is an illustration of a formation of a sinusoidal wave by the combination of a series of Gaussian wave forms.

Refer now to FIGS. 4a and 5. A pulse generator 27 activates a light source 29, such as a laser diode to emit a light signal with an intensity variation that is Gaussian as a function of time represented by the waveform 31 between the time interval $t_0$ and $t_1$. This Gaussian shaped optical pulse is coupled directly to the optical switch 38a and to input terminals of a plurality of switches 35 for selectively coupling to a multiplicity of optical delay lines 37. The switch positions shown in the figure provide delays and increments of $\Delta t_1$ between switches. These delays are associated with a predetermined frequency for the resulting output signal. Signals at other frequencies may be obtained with the selection of other delay increments. After a delay $\Delta t_1$ in delay line 37a the Gaussian shaped optical signal illuminates the photoconductive switch 38b at a time $t_{a1}$ at which the intensity of the un-delayed optical signal is one half the intensity at the peak of the Gaussian wave (3 dB). As stated previously, the electrical signals at the output terminals of the switches 38a, 38b are Gaussian shaped. These signals add at the output terminal 33 in the manner to establish a continuous curve as shown in FIG. 5 between the three dB point 31 of the Gaussian shaped electrical signal from the switch 38a and the three dB point 32 of the Gaussian shaped electrical signal at the output of the switch 38b. When all switches have operated a second light pulse is generated by the light source, thus producing a continuous wave. For a delay as specified separation between positive and negative peak of the resultant waveform $T_p$ is equal to 1.72 $T_3$, where $T_3$ is the time interval between the peak 30 and the 3 dB point of the Gaussian wave. Since $T_P$ is equal to ¼ the period of the resulting sine wave the frequency of the output signal is given by $0.145/T_P$. For example, frequency of the resulting sine wave for an optical signal having a three dB width of 20 picoseconds will provide an electrical signal at a frequency of 14.5 GHz.

Figure 4B:
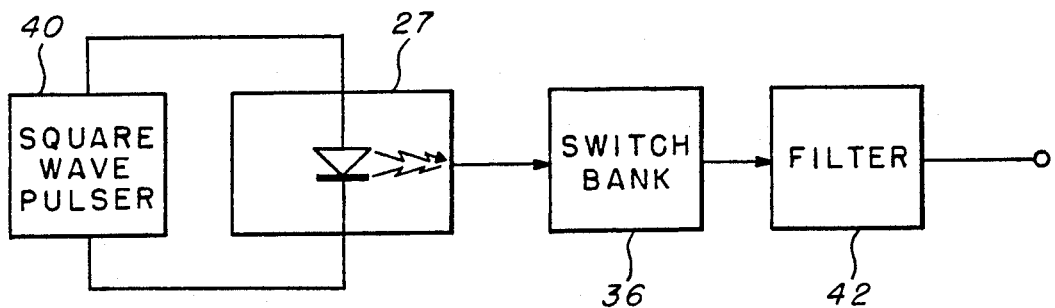
FIG. 4b is a block diagram of another preferred embodiment of the invention.

It should be apparent that a sinusoidal signal may beobtained by square wave modulating the optical light source 29. Refer now to FIG. 4b. A square wave modulator 40 coupled to the light 27 causes square wave modulated light to be coupled to the switch bank 36 from which a sequence of square pulses emerge. These square pulses are coupled to a filter 42 having a center frequency at the desired signal frequency and a bandwidth sufficiently narrow to exclude signals at all other frequencies.

Figure 6:
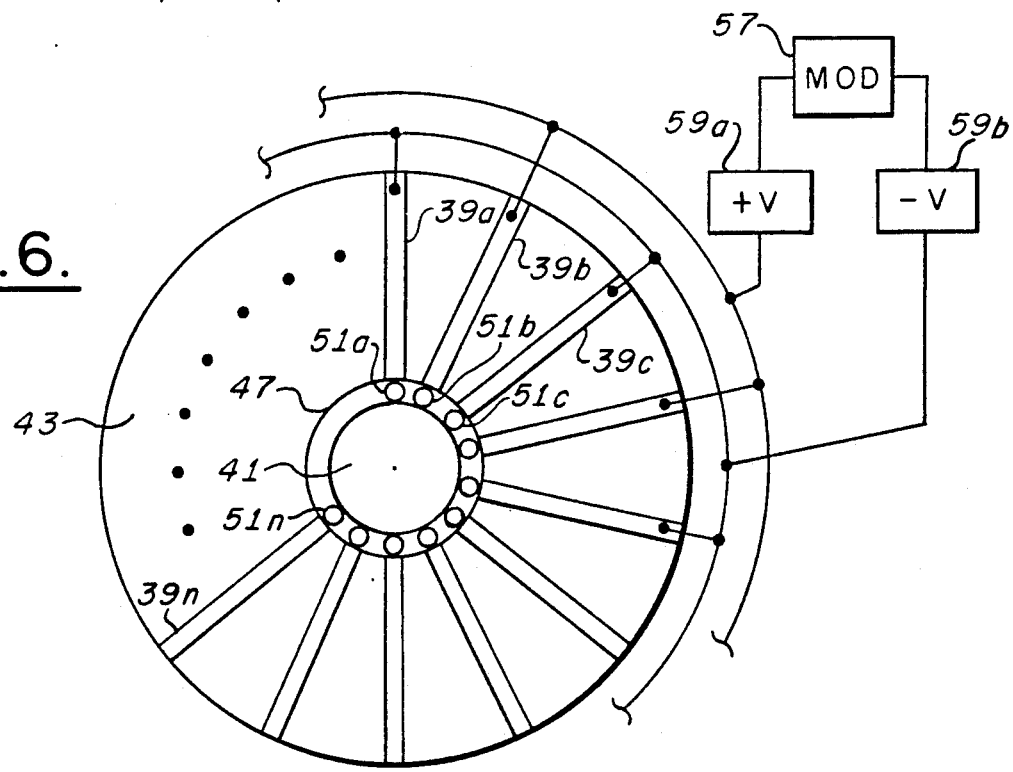
FIGS. 6 and 7 are representations of a preferred embodiment of the invention.
Figure 7:
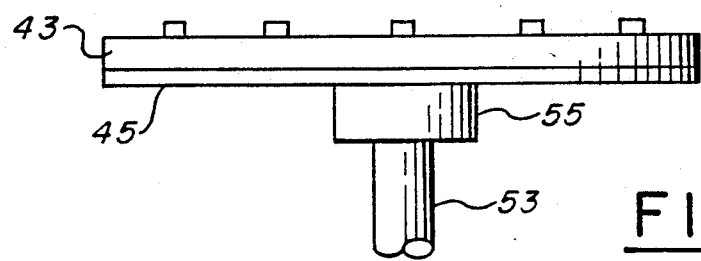

A physical configuration of the invention is shown in FIG. 6 and 7. The switches 37 (FIG. 4) are formed by radial metallic strips 39a through 39n and a central metallic disc 41 positioned on the surface of a photoconductive material 43, such as iron doped indium phosphide (InP:Fe). A metallic sheet 45 covering the entire opposite face of the substrate 43 serves as the ground plane. Each of the metallic strips 39a through 39n terminates on a circle 47 of radius greater than the radius of the disc 41, thereby establishing a gap between the strips and the disc wherein light pulses can be directed to the substrate within the regions 51a through 51n for the sequential operation of the switches. The disc 41 serves as the summing point for the signals at the output terminals of the switches and is coupled to microwave transmission line 53 via a filter 55 which is tuned to the frequency of the desired microwave signal.

The microwave signal generated in accordance with this invention may be amplitude modulated by coupling a modulator 57 to voltage sources 59a and 59b as shown in FIG. 6. Additionally, frequency or phase modulation may be provided by varying the optical signal delay times with the operation of the switches 35 (FIG. 4) in accordance with the modulation desired.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. An apparatus for providing a periodic electrical signal comprising:
   means for providing a sequence of optical energy pulses; and
   means responsive to said sequence of optical energy pulses for providing a substantially sinusoidal electrical signal at a predetermined frequency.

2. An apparatus in accordance with claim 1 wherein said sequence means includes:
   means for providing pulses of optical energy; and
   a plurality of optical delay lines having a common input terminal coupled to receive said pulses of optical energy from said sequence means and a common output terminal for providing a periodic wave of optical energy pulses at said output terminal for each pulse received from said pulses providing means, said periodic wave having an interpulse interval commensurate with said predetermined frequency.

3. An apparatus in accordance with claim 2 wherein said electrical signal means includes:
   source means for providing a first electrical potential having a positive polarity and a second electrical signal having a negative polarity; and
   switch means coupled to said source means and responsive to said periodic sequence of optical energy pulses for alternately coupling said first and second electrical potentials to an output port whereat said continuous electrical signal at said predetermined frequency is provided.

4. An apparatus in accordance with claim 3 further including a filter tuned to said predetermined frequency and coupled between said switch means and said output port.

5. An apparatus in accordance with claim 3 wherein said switch means comprises:
   photoconductive means for providing an electrical conductive path in response to said pulses of optical energy;
   first and second electric conductors positioned on said photoconductive means with a gap therebetween, said first conductor coupled to said source means and said second conductor coupled to an output port whereat said substantially sinusoidal electrical signal at said predetermined frequency is provided when said gap is photon illuminated, such illumination causing an electrical conductive path between said first and second conductors, thereby coupling said source means to said output means.

6. An apparatus in accordance with claim 5 further including a modulator coupled to said source means for amplitude modulating said first and second electrical signals.

7. An apparatus in accordance with claim 2 wherein each of said plurality of optical delay lines includes:
   means for switchably providing one of a plurality of time delays to said pulses of optical energy; and
   means for switching between said plurality of time delays in accordance with an applied modulating signal to provide modulation to said substantially sinusoidal electrical signal.

8. An apparatus in accordance with claim 3 wherein said switch means comprises:
   photoconductive means for providing electrical conductive paths in response to said pulses of optical energy;
   a plurality of metallic strips positioned on said photoconductive means to extend radially from a circle of predetermined radius and coupled to said source means in a manner to provide said positive and negative electrical potentials to alternate metallic strips;
   a metallic disc concentric with said circle and having a radius less than said predetermined radius to form gaps between said plurality of metallic strips and said disc, said gaps positioned relative to said sequence means such that optical pulses sequentially illuminate said gaps.

9. An apparatus in accordance with claim 8 further including a modulator coupled to said source means for amplitude modulating said first and second electrical potentials.

10. An apparatus in accordance with claim 8 wherein each of said plurality of optical delay lines includes:
    means for switchably providing one of a plurality of time delays to said pulses of optical energy; and
    means for switching between said plurality of time delays in accordance with an applied modulating signal to provide modulation to said substantially sinusoidal electrical signal.

* * * * *